(12) United States Patent
Kim et al.

(10) Patent No.: US 11,581,150 B2
(45) Date of Patent: Feb. 14, 2023

(54) PEROVSKITE SILICON TANDEM SOLAR CELL AND METHOD FOR MANUFACTURING THE SAME

(71) Applicant: SEOUL NATIONAL UNIVERSITY R&DB FOUNDATION, Seoul (KR)

(72) Inventors: Jin Young Kim, Seoul (KR); Ik Jae Park, Seoul (KR); Su Geun Ji, Ulsan (KR); You Jin Ahn, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/846,742

(22) Filed: Jun. 22, 2022

(65) Prior Publication Data

US 2022/0319781 A1 Oct. 6, 2022

Related U.S. Application Data

(62) Division of application No. 17/038,740, filed on Sep. 30, 2020, now Pat. No. 11,398,355.

(30) Foreign Application Priority Data

Oct. 1, 2019 (KR) .................. 10-2019-0121867
Sep. 3, 2020 (KR) .................. 10-2020-0112556

(51) Int. Cl.
*H01G 9/20* (2006.01)
*H01L 31/0236* (2006.01)
(Continued)

(52) U.S. Cl.
CPC ............ *H01G 9/20* (2013.01); *H01L 27/302* (2013.01); *H01L 31/02363* (2013.01);
(Continued)

(58) Field of Classification Search
CPC ..... H01G 9/20; H01L 27/302; H01L 31/0725; H01L 31/043; H01L 31/0543;
(Continued)

(56) References Cited

U.S. PATENT DOCUMENTS 4,131,984 A 1/1979 Kaplow et al.
2008/0072958 A1 3/2008 Dutta
(Continued)

FOREIGN PATENT DOCUMENTS

JP 2010232563 A 10/2010

OTHER PUBLICATIONS

Choi et al., Two-terminal mechanical perovskite/silicon tandem solar cells with transparent conductive adhesives, Aug. 2019, Nano Energy, vol. 65, 104044, 1-10. (Year: 2019).
Choi Master's Thesis, Study on Optimal Device Design for 2-terminal Mechanical Perovskite/Silicon Tandem Solar Cells with Transparent Conductive Adhesives, Sep. 2019, Ulsan Graduate School of UNIST. (Year 2019).

*Primary Examiner* — Andrew J Golden
(74) *Attorney, Agent, or Firm* — Kilpatrick Townsend & Stockton LLP

(57) ABSTRACT

Disclosed is a tandem solar cell according to an aspect including: a silicon lower cell; a perovskite upper cell disposed on the silicon lower cell; and a bonding layer for bonding the silicon lower cell and the perovskite upper cell between the silicon lower cell and the perovskite upper cell, wherein the front surface portion of the silicon lower cell being in contact with the bonding layer includes a texture structure, the bonding layer includes a first transparent electrode layer formed on the sidewall of the texture structure, a buried layer filling concave portions of the texture structure on the first transparent electrode layer, and a second transparent electrode layer on top surfaces of the buried layer, the first transparent electrode layer and the texture structure.

7 Claims, 7 Drawing Sheets

(51) Int. Cl.
  *H01L 31/18* (2006.01)
  *H01L 51/42* (2006.01)
  *H01L 31/054* (2014.01)
  *H01L 27/30* (2006.01)

(52) U.S. Cl.
  CPC ...... *H01L 31/0543* (2014.12); *H01L 31/1888* (2013.01); *H01L 51/4213* (2013.01); *H01L 51/4246* (2013.01)

(58) Field of Classification Search
  CPC .............. H01L 31/0687; H01L 31/076; H01L 31/02363; H01L 51/4246; H01L 51/4213
  See application file for complete search history.

(56) References Cited

U.S. PATENT DOCUMENTS

| | | |
|---|---|---|
| 2008/0190479 A1 | 8/2008 | Hsieh et al. |
| 2012/0152340 A1 | 6/2012 | Kondo et al. |
| 2012/0168613 A1 | 7/2012 | Yu et al. |
| 2015/0007864 A1 | 1/2015 | Chiu et al. |
| 2016/0133672 A1 | 5/2016 | Koposov et al. |
| 2017/0084399 A1 | 3/2017 | Vak |
| 2018/0138337 A1 | 5/2018 | Tamboli et al. |
| 2018/0158976 A1 | 6/2018 | Ahn |
| 2018/0174761 A1 | 6/2018 | Kamino et al. |
| 2018/0226529 A1 | 8/2018 | Uzu et al. |
| 2019/0081189 A1 | 3/2019 | Mishima et al. |

PEROVSKITE SILICON TANDEM SOLAR CELL AND METHOD FOR MANUFACTURING THE SAME

CROSS-REFERENCE TO RELATED APPLICATION

This application is a divisional application of U.S. patent application Ser. No. 17/038,740, filed on Sep. 30, 2020, which is based on and claims priority under 35 U.S.C. § 119 to Korean Patent Application No. 10-2019-0121867, filed on Oct. 1, 2019 in the Korean Intellectual Property Office, and Korean Patent Application No. 10-2020-0112556, filed on Sep. 3, 2020 in the Korean Intellectual Property Office, the disclosures of which are incorporated by reference herein in their entireties.

BACKGROUND

1. Field

The present disclosure relates to a tandem solar cell including a silicon lower cell and a perovskite upper cell and a method for manufacturing the same.

2. Description of Related Art

A solar cell is an environmentally-friendly device that converts solar energy into electric energy. Photovoltaic power generation is enabled when sunlight is absorbed into a light absorbing layer of a solar cell and electron-hole pairs are generated. Only the incident sunlight having a bandgap greater than the light absorbing layer is absorbed into the light absorbing layer, and the energy of the incident sunlight having a bandgap not greater than that of the light absorbing layer is consumed as thermal energy. Therefore, in order to efficiently utilize sunlight, tandem solar cells employing a multitude of light absorbing layers having different bandgaps are receiving much attention.

Perovskite materials currently receiving much attention as light absorbing layer materials for next-generation solar cells are capable of easily adjusting bandgaps and efficiently distributing incident light with respect to a lower cell of the thin film solar cell when the light absorbing layer is bonded to the lower cell made of, for example, a silicon, copper indium gallium selenide (CIGS), or copper zinc tin sulfide (CZTS). In addition, the perovskite material is capable of forming a thin film using a low-temperature solution process, and thus the manufacturing cost may be reduced.

In order to reduce reflection of incident light, the silicon solar cell of the lower cell employs a pyramidal texture structure on its front surface portion, and the size of the texture structure is generally in micrometer (μm) scales. Meanwhile, the perovskite light absorbing layer of the upper cell has a thickness of several hundred nanometers, and it is difficult to uniformly form layers with such a thickness scale on the micrometer-scale texture structure using a solution process.

Therefore, the tandem device including a perovskite upper cell using the conventional solution process and a silicon lower cell having a texture structure may have a reduced photoelectric conversion efficiency due to a non-uniformly formed perovskite light absorbing layer. Meanwhile, in the tandem device including a perovskite upper cell using the conventional solution process and a silicon lower cell without a texture structure, a uniform perovskite layer may be formed in the upper cell, but the loss of light may be unavoidably generated due to the front surface reflection of the silicon lower cell.

SUMMARY

In order to solve the problems occurring in the prior art, the present disclosure provides a silicon perovskite tandem solar cell capable of uniformly forming a light conversion layer in a perovskite upper cell on a texture structure of a silicon lower cell using a solution process, and a method for manufacturing the same.

Additional aspects will be set forth in part in the description which follows and, in part, will be apparent from the description, or may be learned by practice of the presented embodiments of the disclosure.

According to an aspect, provided is a tandem solar cell. The solar cell includes:
a silicon lower cell;
a perovskite upper cell disposed on the silicon lower cell; and
a bonding layer for bonding the silicon lower cell and the perovskite upper cell between the silicon lower cell and the perovskite upper cell.

The front surface portion of the silicon lower cell being in contact with the bonding layer may include a texture structure.

The bonding layer may include
a first transparent electrode layer formed on the sidewall of the texture structure,
a buried layer filling concave portions of the texture structure on the first transparent electrode layer, and
a second transparent electrode layer on top surfaces of the buried layer, the first transparent electrode layer and the texture structure.

The texture structure may have a truncated pyramid shape.

The second transparent electrode layer may be in contact with the first transparent electrode layer exposed between the texture structure and the buried layer.

The top surfaces of the buried layer, the first transparent electrode layer and the texture structure may form a flat plane.

The texture structure may have a size in the range of sub micrometers to several tens of micrometers.

Each of the first transparent electrode layer and the second transparent electrode layer may independently include aluminum zinc oxide (AZO), indium tin oxide (ITO), fluorine doped tin oxide (FTO), or indium zinc oxide (IZO).

The buried layer may have a lower refractive index than layers adjacent thereto.

The buried layer may include a thermally curable or photocurable polymer material.

The buried layer may include an epoxy resin, an acryl resin, a siloxane resin, a vinyl acetate resin.

The tandem solar cell may further include a lower electrode connected to the silicon lower cell, and
an upper electrode connected to the perovskite upper cell.

According to another aspect, provided is a method for manufacturing the tandem solar cell.

The method for manufacturing the tandem solar cell may include the steps of:
forming a pre-texture structure by texturing a front surface portion of a silicon lower cell;
forming a first transparent electrode layer on the pre-texture structure to a uniform thickness;

forming a buried layer on the first transparent electrode layer to cover the pre-texture structure;

forming a texture structure by etching top portions of the buried layer, the first transparent electrode layer and the pre-texture structure, and exposing top surfaces of the buried layer filling the concave portions of the texture structure, the texture structure, and the first transparent electrode layer between the buried layer and the texture structure;

forming a second transparent electrode layer on the exposed top surfaces of the buried layer, the first transparent electrode layer and the texture structure; and forming a perovskite upper cell on the second transparent electrode layer.

The top surfaces of the buried layer, the first transparent electrode layer and the texture structure may form a flat plane.

The texture structure may have a size in the range of sub micrometers to several tens of micrometers.

The step of etching the top portions of the buried layer, the first transparent electrode layer and the texture structure may include chemical etching, physical etching or chemical mechanical polishing.

The buried layer may have a lower refractive index than layers adjacent thereto.

The step of forming the perovskite upper cell may include:

forming a hole transport layer on the second transparent electrode layer;

forming a perovskite light absorbing layer on the hole transport layer; and forming an electron transport layer on the perovskite light absorbing layer.

The perovskite light absorbing layer may be formed by a solution process.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
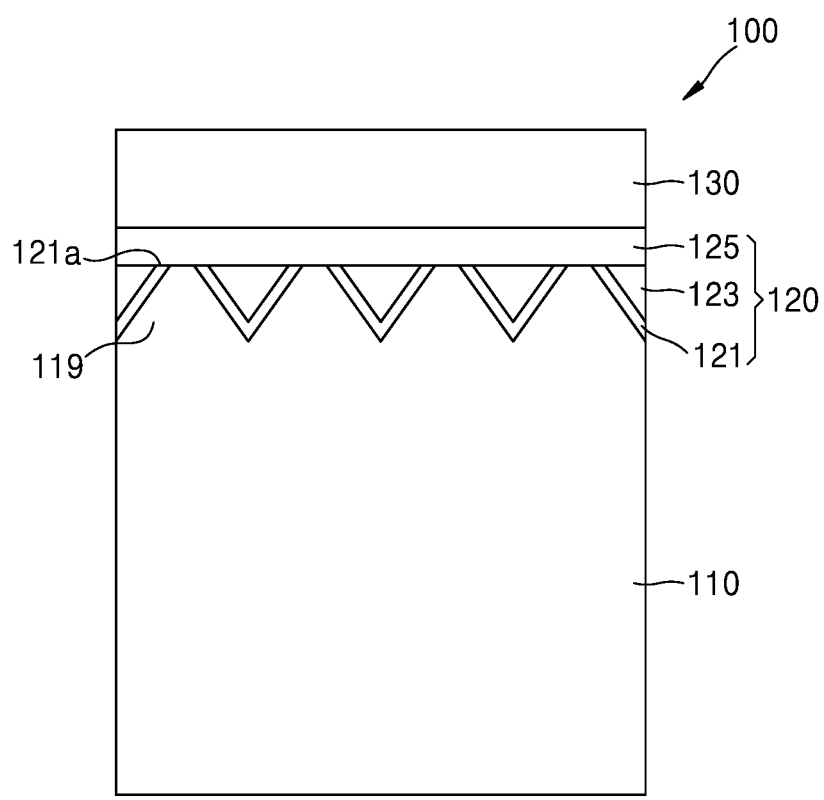
FIG. 1 is a cross-sectional view schematically illustrating a configuration of a perovskite silicon tandem solar cell according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular example embodiments only and is not intended to be limiting of the present inventive concept. An expression used in the singular encompasses the expression of the plural, unless it has a clearly different meaning in the context. As used herein, it is to be understood that the terms such as "includes," "have," and "comprise" are intended to indicate the presence of the features, numbers, steps, actions, components, parts, ingredients, materials, or combinations thereof disclosed in the specification, but do not preclude the possibility that one or more other features, numbers, steps, actions, components, parts, ingredients, materials, or combinations thereof may exist or may be added.

In the drawings, the diameters, lengths, and thicknesses of layers and regions are exaggerated or reduced for clarity. Throughout the specification, it is to be understood that when a component, such as a layer, a film, a region, or a plate, is referred to as being "on" another component, the component can be directly on the other component or intervening components may be present thereon. Throughout the specification, the terms "first," "second," etc. may be used to describe various elements, these elements, components, regions, layers and/or sections should not be limited by these terms. These terms are only used to distinguish one element from another element. In addition, throughout the specification and drawings, an identical or corresponding element will be referred to as an identical reference numeral, and repeated descriptions will not be given.

As used herein, a lower cell means a solar cell formed at a lower portion of a tandem solar cell, and a silicon lower cell means a solar cell in a case where the solar cell formed at the lower portion of the tandem solar cell is a silicon solar cell. Likewise, as used herein, an upper cell means a solar cell formed at an upper portion of a tandem solar cell, and a perovskite upper cell means a solar cell in a case where the solar cell formed at the upper portion of the tandem solar cell is a perovskite solar cell.

As used herein, a texture structure means a structure formed in the silicon solar cell and may include not only a structure formed by a general texturing process but also a structure derived therefrom.

As used herein, a silicon solar cell is a solar cell in which a light absorbing layer contains silicon and a perovskite solar cell means a solar cell in which a light absorbing layer contains a material having a perovskite structure.

As used herein, a perovskite light absorbing layer means a light absorbing layer including a light absorbing material having a perovskite structure.

Hereinafter, tandem solar cells according to one or more embodiments and a method for manufacturing the same will be described in further detail with reference to the accompanying drawings.

<Tandem Solar Cell>

FIG. 1 is a cross-sectional view schematically illustrating a configuration of a perovskite silicon tandem solar cell according to an embodiment.

Referring to FIG. 1, the perovskite silicon tandem solar cell 100 includes a silicon lower cell 110, a bonding layer 120 and a perovskite upper cell 130.

The silicon lower cell 110 may have one of known silicon solar cell structures, but embodiments of the present disclosure are not limited thereto. In an example embodiment, the silicon lower cell 110 may include a crystalline silicon substrate (not shown), a p-type amorphous or crystalline silicon layer (not shown), an n-type amorphous or crystalline silicon layer (not shown), and an amorphous intrinsic silicon layer (not shown). In addition to the above-described layers, the silicon lower cell 110 may further include additional layers as necessary.

The front surface portion of the silicon lower cell 110 being in contact with the bonding layer 120 may have a texture structure 119 having a truncated pyramid shape. The front surface portion of the silicon lower cell 110 may be a silicon layer. The texture structure 119 may have a size in the range of sub micrometers to several tens of micrometers. In an example embodiment, the texture structure 119 may have a width and height in the range of 0.1 μm to 5 μm. The texture structure 119 of the silicon lower cell 110 may reduce the reflection of incident light and increase the path of the incident light to improve light collection efficiency, thereby increasing the absorption efficiency of sunlight.

The bonding layer 120 is a layer that physically bonds and electrically connects the silicon lower cell 110 and the perovskite upper cell 130 to each other. The bonding layer 120 includes: a first transparent electrode layer 121 formed on the sidewall of the texture structure 119 of the front surface portion of the silicon lower cell 110; a buried layer 123 filling concave portions of the texture structure 119 so as to expose top surface parts 121a of the first transparent electrode layer 121; and a second transparent electrode layer 125 covering top surfaces of the buried layer 123, the first transparent electrode layer 121 and the silicon lower cell 110.

The first transparent electrode layer 121 and the buried layer 123 fill the texture structure 119 of the silicon lower cell 110 to thus planarize the front surface portion of the silicon lower cell 110. The second transparent electrode layer 125 is formed on the flat top surface of the silicon lower cell 110, which is planarized by being filled with the first transparent electrode layer 121 and the buried layer 123. Since the top surface parts 121a of the first transparent electrode layer 121, exposed to the top surface of the silicon lower cell 110, are in contact with the second transparent electrode layer 125, the silicon lower cell 110 is electrically connected to the second transparent electrode layer 125 through the first transparent electrode layer 121.

Each of the first transparent electrode layer 121 and the second transparent electrode layer 125 may independently include a conductive metal oxide, such as aluminum zinc oxide (AZO), indium tin oxide (ITO), fluorine doped tin oxide (FTO), or indium zinc oxide (IZO). In an example embodiment, the first transparent electrode layer 121 may have a thickness in the range of 5 nm to 300 nm. When the first transparent electrode layer 121 has a thickness in the range stated above, the first transparent electrode layer 121 may be formed on the sidewall of the texture structure 119 to a uniform thickness, and its surface being in contact with the second transparent electrode layer 125 may be stably maintained. In an example embodiment, the second transparent electrode layer 125 may have a thickness in the range of 5 nm to 100 nm. When the first transparent electrode layer 121 and the second transparent electrode layer 125 have a thickness in the range stated above, they may be electrically connected to each other to serve as a recombination layer.

The buried layer 123 may include a transparent material having refractive index in the range of about 1 to about 3. The buried layer 123 may include, for example, a thermally curable or photocurable polymer material. The thermally curable or photocurable transparent polymer material may include, for example, an epoxy resin, an acryl resin, a siloxane resin, a vinyl acetate resin, or a combination thereof, but embodiments of the present disclosure are not limited thereto. When the buried layer 123 have the refractive index in the range of about 1 to about 3, the buried layer 123 may have a refractive index similar to the layers adjacent thereto. In detail, the buried layer 123 may have a similar refractive index to the layers forming the silicon lower cell 110 and the layers forming the perovskite upper cell 130. When the buried layer 123 has a refractive index similar to the layers adjacent thereto, the reflection of incident light may be minimized. Optionally, the buried layer 123 may further include conductive particles unless the refractive index or transmission rate is not affected.

The perovskite upper cell 130 disposed on the bonding layer 120 may have one of known perovskite solar cell structures, and the structure of the perovskite upper cell 130 is not particularly limited. In an example embodiment, the perovskite upper cell 130 may include a hole transport layer (not shown), a perovskite light absorbing layer (not shown), and an electron transport layer (not shown).

The hole transport layer may include, for example, a conductive polymer material or a conductive inorganic material. The conductive polymer material may include, for example, polyaniline, polypyrrole, polythiophene, poly-3,4-ethylene dioxythiophene-polystyrene sulfonate (PEDOT-PSS), poly-[bis(4-phenyl)(2,4,6-trimethylphenyl)amine] (PTAA), spiro-MeOTAD or polyaniline-camphor sulfonic acid (PANI-CSA), but embodiments of the present disclosure are not limited thereto. The conductive inorganic material may include NiO, $WO_3$, or CuSCN, but embodiments of the present disclosure are not limited thereto. In an example embodiment, the hole transport layer may have a thickness in the range of 5 nm to 300 nm.

The light absorbing layer may include a light absorbing material having a perovskite structure. The light absorbing layer having a perovskite structure may include, for example, organic halide perovskite or metal halide perovskite.

The organic halide perovskite may include, for example, $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ (0≤x≤1, 0≤y≤1), but embodiments of the present disclosure are not limited thereto. In addition, a compound partially doped with Cs or Rb in the organic ammonium moiety may also be used as the organic halide perovskite. The metal halide perovskite may include, for example, lead iodide (PbI2), lead bromide (PbBr) or lead chloride (PbCl2). The light absorbing layer may have a thickness in the range of several tens to several hundreds of nanometers. In an example embodiment, the light absorbing layer may have a thickness in the range of 100 nm to 1000 nm.

The electron transport layer may include, for example, $TiO_2$, $SnO_2$, ZnO, $TiSrO_3$, graphene, carbon nanotubes, [6,6]-phenyl-$C_{61}$-butyric acid methyl ester (PCBM), or a combination thereof, but embodiments of the present disclosure are not limited thereto. In an example embodiment, the electron transport layer may have a thickness in the range of 1 nm to 300 nm.

In addition to the above-described layers, the perovskite upper cell 130 may further include additional layers as necessary.

In addition, the perovskite silicon tandem solar cell 100 may further include a lower electrode (not shown) connected to the silicon lower cell 110 and an upper electrode (not shown) connected to the perovskite upper cell 130.

The perovskite silicon tandem solar cell according to the present embodiment may have an increased absorption efficiency of the sunlight by reducing the reflection of the sunlight using the texture structure of the silicon lower cell.

In addition, a bonding layer is planarly formed on the texture structure, thereby forming the perovskite upper cell reliably.

<Manufacturing Method of Tandem Solar Cell>

FIGS. 2A to 2E are schematic cross-sectional views sequentially illustrating a method for manufacturing a perovskite silicon tandem solar cell according to an embodiment.

Figure 2A:
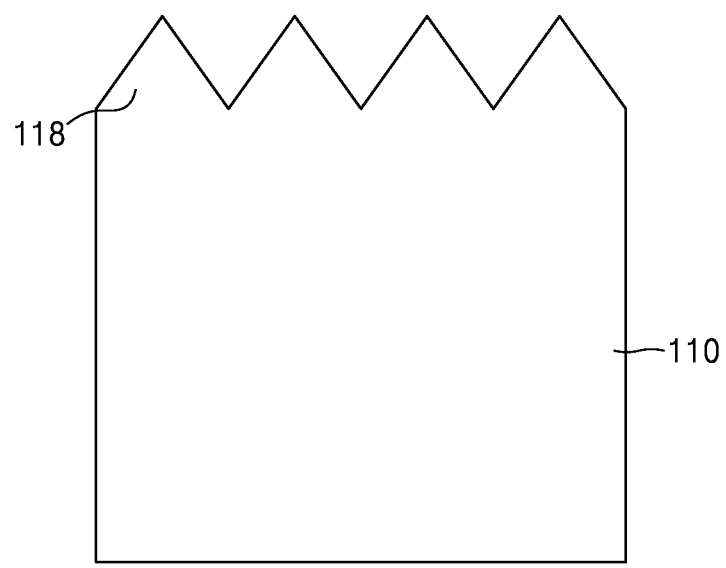
FIGS. 2A to 2F are schematic cross-sectional views sequentially illustrating a method for manufacturing a perovskite silicon tandem solar cell according to an embodiment.

First, referring to FIG. 2A, a pre-texture structure 118 may be formed by texturing a front surface portion of a silicon lower cell 110. The front surface portion of the silicon lower cell 110 may be a silicon layer. Although not shown in FIG. 2A, as described above, the silicon lower cell 110 may include a p-type amorphous or crystalline silicon layer (not shown), an n-type amorphous or crystalline silicon layer (not shown), and an amorphous intrinsic silicon layer (not shown), and may have a variety of structures without being limited thereto. The texturing may be performed through, for example, etching or grooving. The pre-texture structure 118 may have, for example, a pyramidal shape. At the time of etching for texturing, for example, a basic solution, such as potassium hydroxide (KOH) or sodium hydroxide (NaOH), or an acid solution, such as nitric acid (HNO3) or fluoric acid (HF). The grooving for texturing may be performed using, for example, laser. Meanwhile, a rear surface portion of the silicon lower cell 110 may have a texture structure or a planar structure.

Figure 2B:
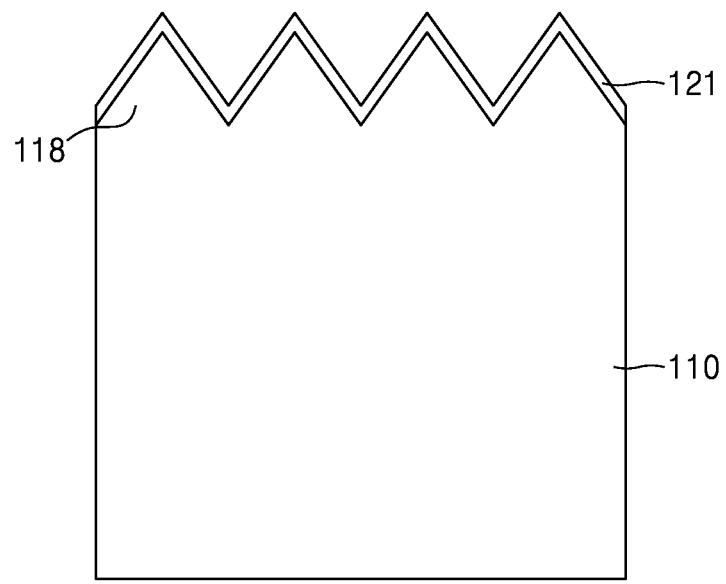

Referring to FIG. 2B, a first transparent electrode layer 121 may be formed on the pre-texture structure 118. The first transparent electrode layer 121 may be made of a conductive metal oxide, such as, for example, ITO, AZO, FTO, or IZO. The conductive metal oxide of the first transparent electrode layer 121 may be formed using, for example, sputtering or spin coating. In an example, the first transparent electrode layer 121 may be conformally formed to have a uniform thickness so as to maintain irregularities of the texture structure 119. In an example embodiment, the first transparent electrode layer 121 may have a thickness in the range of 5 nm to 300 nm.

Figure 2C:
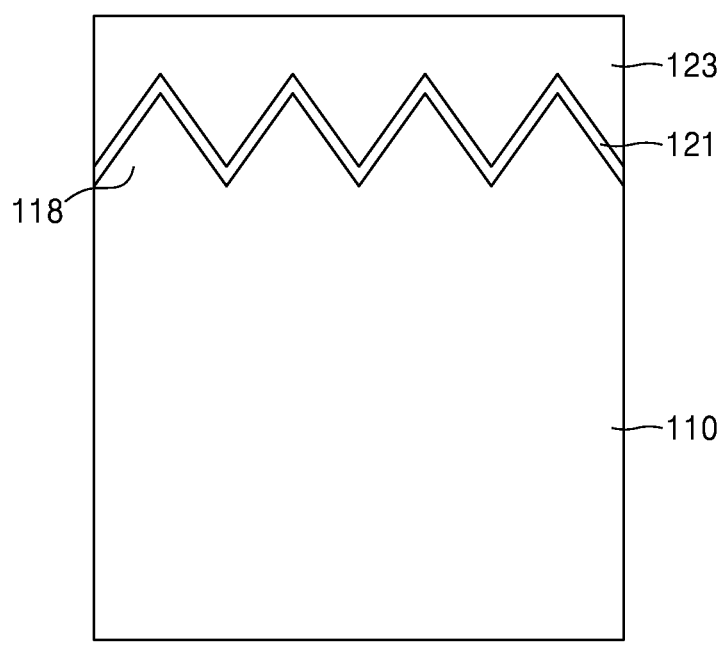

Referring to FIG. 2C, a buried layer 123 may be formed on the first transparent electrode layer 121 so as to cover completely the pre-texture structure 118 of the silicon lower cell 110. The buried layer 123 may be made of, for example, a thermally curable or photocurable polymer material having a refractive index in the range of about 1 to about 3. The buried layer 123 may be made of, for example, an epoxy resin, an acryl resin, a siloxane resin, a vinyl acetate resin, or a combination thereof. Optionally, the buried layer 123 may further include conductive particles. The buried layer 123 may be formed to have an appropriate thickness so as to perform a planarization process on the lower texture structure 119.

Figure 2D:
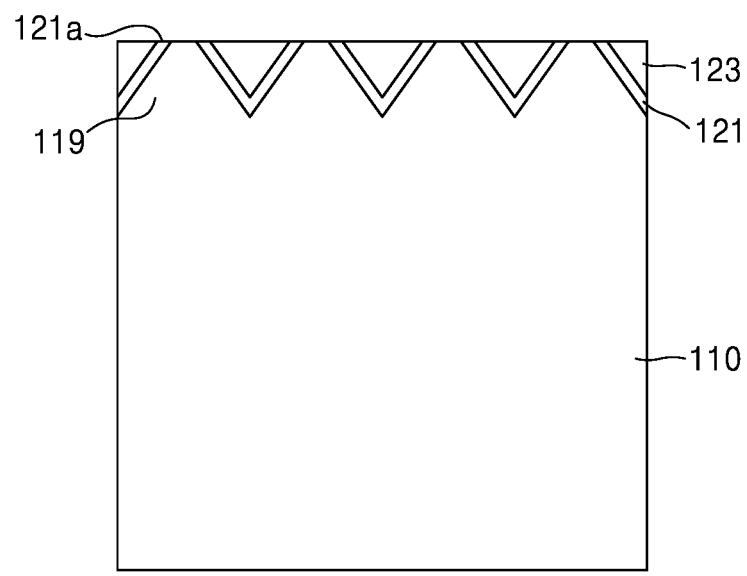

Referring to FIG. 2D, the top surface of the silicon lower cell 110 may be planarized while exposing the first transparent electrode layer 121, by etching top portions of the buried layer 123, the first transparent electrode layer 121 and the pre-texture structure 118. During the planarization process, chemical etching, physical etching or chemical mechanical polishing may be used. In an example embodiment, a compound or a suspension, including silica, diamond, alumina or cesium oxide, may be used to perform the chemical mechanical polishing. The top portion of the pre-texture structure 118 is etched to form a texture structure 119, and the top surface of the buried layer 123 filling the concave portions of the texture structure 119 and top surface parts 121a of the first transparent electrode layer 121 are exposed.

Figure 2E:
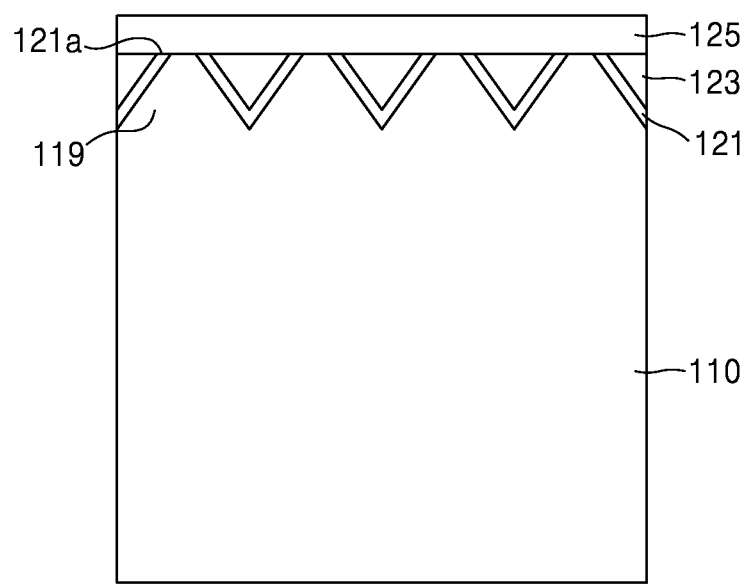

Referring to FIG. 2E, a second transparent electrode layer 125 may be formed on the texture structure 119, the first transparent electrode layer 121 and the buried layer 123, which are exposed after the etching for planarization. The second transparent electrode layer 125 may include, for example, AZO, ITO, FTO, or IZO. The second transparent electrode layer 125 may be made of the same material as the first transparent electrode layer 121. Optionally, the second transparent electrode layer 125 may be made of a different material from the first transparent electrode layer 121. The second transparent electrode layer 125 is in contact with the first transparent electrode layer 121 to then be electrically connected thereto. The first transparent electrode layer 121, the buried layer 123 and the second transparent electrode layer 125 may form a bonding layer 120 connecting the silicon lower cell 110 and the perovskite upper cell 130. Electrons from the silicon lower cell 110 and holes from the perovskite upper cell 130 are recombined at the first transparent electrode layer 121 and the second transparent electrode layer 125 in the bonding layer 120, thereby maintaining charge neutrality.

Figure 2F:
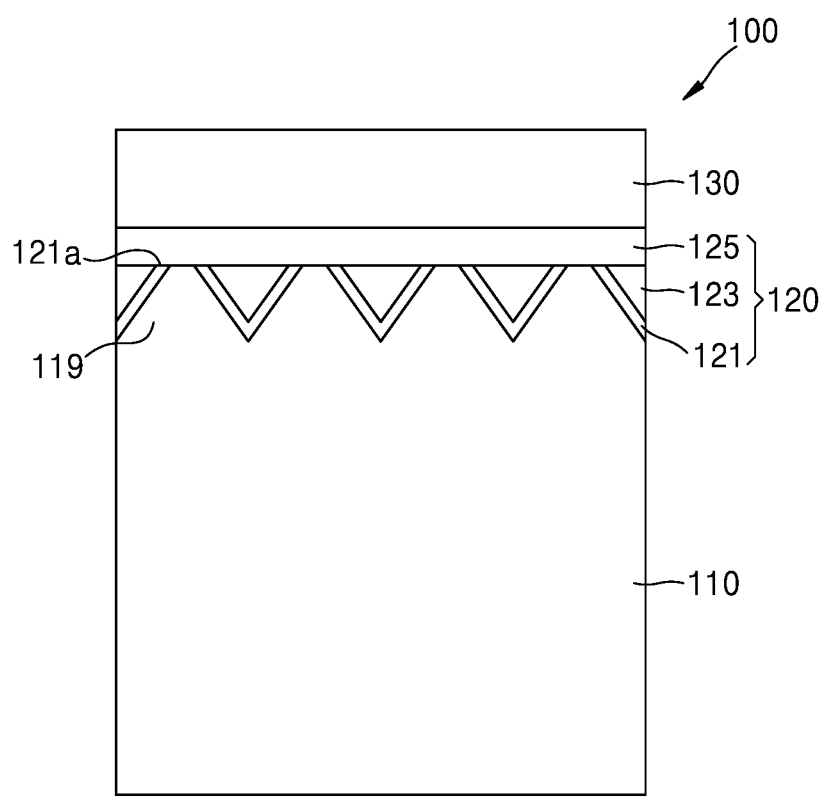

Referring to FIG. 2F, the perovskite upper cell 130 may be formed on the second transparent electrode layer 125. The perovskite upper cell 130 may be formed by a publicly known method. Although not shown in FIG. 2F, the perovskite upper cell 130 may include a hole transport layer, a light absorbing layer, and an electron transport layer. As to the hole transport layer, the light absorbing layer and the electron transport layer according to the present embodiment, reference may be made to the description of the tandem solar cell according to the previous embodiment.

In an example embodiment, the hole transport layer, the light absorbing layer and the electron transport layer may be sequentially formed on the second transparent electrode layer 125, thereby forming the perovskite upper cell 130. The hole transport layer may be formed by, for example, spin coating or thermally evaporating a conductive polymer or a conductive inorganic material such as NiO, $WO_3$ or CuSCN on second transparent electrode layer 125. The light absorbing layer may be formed on the hole transport layer using a light absorbing material having a perovskite structure. The light absorbing layer may be formed by, for example, spin coating a solution prepared by dissolving a precursor material of organic halide perovskite or metal halide perovskite on the hole transport layer. The electron transport layer may be formed on the light absorbing layer using, for example, $TiO_2$, $SnO_2$, ZnO, $TiSrO_3$, graphene, carbon nanotubes or PCBM, by sol-gel method, spin coating or thermal evaporation. In another example embodiment, the electron transport layer may be formed on the second transparent electrode layer 125, and the hole transport layer may be formed on the the light absorbing layer. According to another embodiment, additional layers may be further formed when forming the perovskite upper cell 130.

According to embodiments of the present disclosure, the top portion of the texture structure formed on the front surface portion of the silicon lower cell may be planarized at the time of forming a bonding layer, and thus a perovskite upper cell may be easily and reliably formed at low cost by employing a solution process. The thus formed perovskite silicon tandem solar cell may have an increased photoelectric conversion efficiency by forming the perovskite upper cell reliably while maintaining the texture structure of the silicon lower cell.

According to the configuration of the perovskite silicon tandem solar cell and the method for manufacturing the same of the present disclosure, a perovskite upper cell may be reliably formed on a silicon lower cell having a texture structure on the front surface portion thereof using a solution process, and thus the perovskite silicon tandem solar cell having excellent performance may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method for manufacturing a tandem solar cell, the method comprising the steps of:
    forming a pre-texture structure by texturing a front surface portion of a silicon lower cell;
    forming a first transparent electrode layer on the pre-texture structure to a uniform thickness;
    forming a buried layer on the first transparent electrode layer to cover the pre-texture structure;
    forming a texture structure by etching top portions of the buried layer, the first transparent electrode layer and the pre-texture structure, and exposing top surfaces of the buried layer filling the concave portions of the texture structure, the texture structure, and the first transparent electrode layer between the buried layer and the texture structure;
    forming a second transparent electrode layer on the exposed top surfaces of the buried layer, the first transparent electrode layer and the texture structure; and
    forming a perovskite upper cell on the second transparent electrode layer.

2. The method of claim 1, wherein the top surfaces of the buried layer, the first transparent electrode layer and the texture structure forms a flat plane.

3. The method of claim 1, wherein the texture structure has a size in the range of sub micrometers to several tens of micrometers.

4. The method of claim 1, wherein the step of etching the top portions of the buried layer, the first transparent electrode layer and the texture structure comprises chemical etching, physical etching or chemical mechanical polishing.

5. The method of claim 1, wherein the buried layer comprises a thermally curable or photocurable polymer material.

6. The method of claim 1, wherein the step of forming the perovskite upper cell comprises:
    forming a hole transport layer on the second transparent electrode layer;
    forming a perovskite light absorbing layer on the hole transport layer; and
    forming an electron transport layer on the perovskite light absorbing layer.

7. The method of claim 1, wherein the perovskite light absorbing layer is formed by a solution process.

* * * * *